United States Patent
Misawa et al.

(10) Patent No.: US 11,061,911 B2
(45) Date of Patent: Jul. 13, 2021

(54) DRIVING DATA ANALYZER

(71) Applicants: DENSO CORPORATION, Kariya (JP); The Ritsumeikan Trust, Kyoto (JP)

(72) Inventors: Hideaki Misawa, Kariya (JP); Kazuhito Takenaka, Kariya (JP); Tadahiro Taniguchi, Kusatsu (JP)

(73) Assignees: DENSO CORPORATION, Kariya (JP); THE RITSUMEIKAN TRUST, Kyoto (JP)

(*) Notice: Subject to any disclaimer, the term of this patent is extended or adjusted under 35 U.S.C. 154(b) by 169 days.

(21) Appl. No.: 16/158,865

(22) Filed: Oct. 12, 2018

(65) Prior Publication Data

US 2019/0114345 A1 Apr. 18, 2019

(30) Foreign Application Priority Data

Oct. 13, 2017 (JP) .............................. JP2017-199379

(51) Int. Cl.
| | |
|---|---|
| *B60W 50/06* | (2006.01) |
| *G06F 16/2457* | (2019.01) |
| *B60W 40/09* | (2012.01) |
| *H03M 7/30* | (2006.01) |

(52) U.S. Cl.
CPC ......... *G06F 16/2457* (2019.01); *B60W 40/09* (2013.01); *B60W 50/06* (2013.01); *H03M 7/3079* (2013.01); *H03M 7/3082* (2013.01); *B60W 2540/30* (2013.01); *H03M 7/30* (2013.01)

(58) Field of Classification Search
CPC ......... B60W 2040/0818; B60W 40/09; B60W 40/10; G06F 16/2457; G06F 3/048
USPC ......................................................... 707/755
See application file for complete search history.

(56) References Cited

U.S. PATENT DOCUMENTS 9,495,874 B1 * 11/2016 Zhu ..................... G08G 1/165
10,156,848 B1 * 12/2018 Konrardy ............... G01C 21/34

FOREIGN PATENT DOCUMENTS

JP 2013-250663 A 12/2013

* cited by examiner

*Primary Examiner* — Hung T Vy
(74) *Attorney, Agent, or Firm* — Maschoff Brennan (57) ABSTRACT

In a driving data analyzer, a data collector collects, from at least one vehicle, driving data sequences while each of the driving data sequences is correlated with identification data. Each driving data sequence includes sequential driving data items, and each driving data item represents at least one of a driver's operation of at least one vehicle and a behavior of the at least one vehicle based on the at least one of a driver's operation. The identification data represents a type of at least one external factor that contributes to variations in the driving data items. A feature extractor applies a data compression network model to the driving data sequences to thereby extract, from the driving data sequences, at least one latent feature independently from the type of the at least one external factor.

12 Claims, 8 Drawing Sheets

DRIVING DATA ANALYZER

CROSS REFERENCE TO RELATED APPLICATION

This application is based on and claims the benefit of priority from Japanese Patent Application No. 2017-199379 filed on Oct. 13, 2017, the disclosure of which is incorporated in its entirety herein by reference.

TECHNICAL FIELD

The present disclosure relates to technologies for analyzing driving data of a vehicle.

BACKGROUND

A driving assist system aims to assist driver's driving of a vehicle according to various driving situations. For achieving such an object, the driving assist system suitably analyzes the driving situations of an own vehicle.

Japanese Patent Application Publication No. 2013-250663 discloses a technology that collects a large amount of various items of data associated with driver's driving operations and behaviors of an own vehicle as a driving data group. Then, this technology analyzes the driving data group to correspondingly extract driving scenes each representing similar driving situations, thus performing driver's driving assist in accordance with each of the driving scenes.

SUMMARY

The inventors of the present application have studied in detail the published technology, and correspondingly have found the following issue.

Specifically, because drivers may have different driving habits, all drivers may not necessarily perform the same driving operations, i.e. driving actions, in the same driving scene. For example, when driving an own vehicle to go around a curve, a driver sufficiently decelerates the own vehicle immediately before the curve, and thereafter, turns the steering wheel, while another driver may turn the steering wheel at the same time as decelerating the own vehicle. Additionally, various types of vehicles have individually different travelling characteristics for each type. These driving habits and the travelling characteristics depend on the driving data group.

If the published technology extracts driving scenes in accordance with the driving data group on which the driving habits and the travelling characteristics depend, a first driving scene in the extracted driving scenes may be different from a second driving scene in the extracted driving scenes although the first and second driving scenes represent the same or similar driving situations. For example, if different drivers drive the same type of vehicle on the same road, the driving scenes for the different drivers may be extracted as different driving scenes. In addition, if the same driver drives different types of vehicles on the same road, the driving scenes for the different types of vehicles may be extracted as different driving scenes.

This may make it difficult to extract, from the driving data group, driving scenes, each of which is (1) Independent of external factors including driver's habits and different types of vehicles (2) Common to all drivers and all types of vehicles In view of the circumstances set forth above, one aspect of the present disclosure seeks to provide technologies, each of which is capable of analyzing a driving data group independently of such external factors.

According to an exemplary aspect of the present disclosure, there is provided a driving data analyzer. The driving data analyzer includes a data collector collects, from at least one vehicle, driving data sequences while each of the driving data sequences is correlated with identification data. Each driving data sequence includes sequential driving data items, and each driving data item represents at least one of a driver's operation of at least one vehicle and a behavior of the at least one vehicle based on the at least one of a driver's operation. The identification data represents a type of at least one external factor that contributes to variations in the driving data items. The driving data analyzer includes a feature extractor applies a data compression network model to the driving data sequences to thereby extract, from the driving data sequences, at least one latent feature independently from the type of the at least one external factor.

This configuration of the driving data analyzer extracts, from the driving data sequences, at least one latent feature independently from the type of the at least one external factor. This therefore enables a robust data analysis based on the at least one latent feature to be carried out.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

The following describes embodiments of the present disclosure with reference to the accompanying drawings. In the embodiments, like parts between the embodiments, to which like reference characters are assigned, are omitted or simplified to avoid redundant description.

First Embodiment

The following describes a driving data analyzer 1 according to the first embodiment of the present disclosure with reference to FIGS. 1 to 4.

Figure 1:
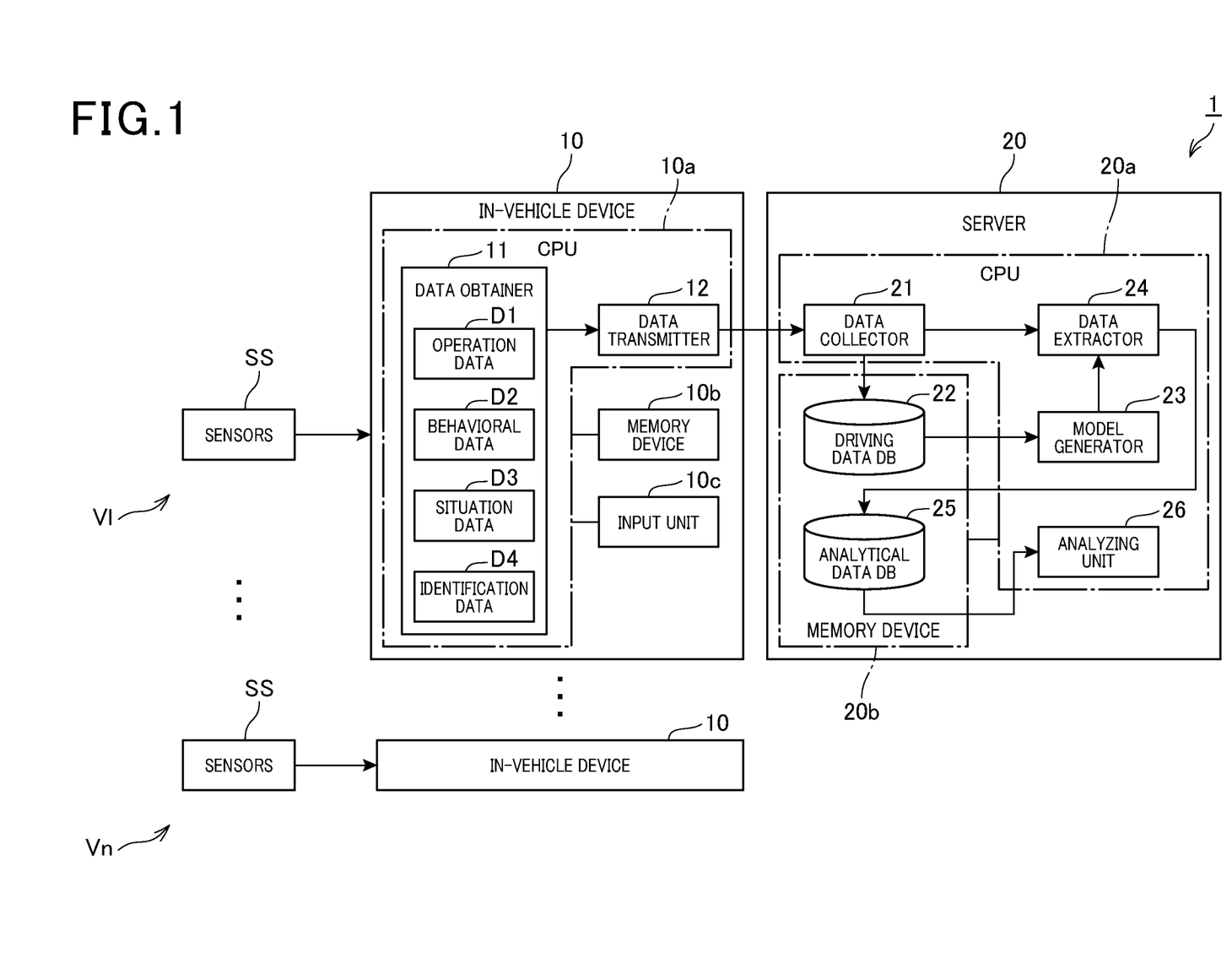
FIG. 1 is a block diagram schematically illustrating an example of the functional structure of a driving data analyzer according to the first embodiment of the present disclosure.

Referring to FIG. 1, the driving data analyzer 1 includes in-vehicle units 10 respectively installed in a plurality of vehicles V1, . . . , Vn, and a server 20 communicable by radio with the in-vehicle units 10.

The in-vehicle units 10 serve as mobile terminals at least partly provided in the respective vehicles V1 to Vn. Each of the in-vehicle units 10 is configured mainly as at least one known microcomputer including a CPU, i.e. a processor, 10a, a memory device 10b, and an input unit 10c. The memory device 10b includes, for example, at least one of semiconductor memories, such as a RAM, a ROM, and a flash memory. These semiconductor memories include at least one non-transitory computer-readable storage medium.

For example, the CPU 10a of each in-vehicle unit 10 can run one or more programs, i.e. sets of program instructions, stored in the memory device 10b, thus implementing various functions of the in-vehicle unit 10 as software operations. In other words, the CPU 10a can run programs stored in the memory device 10b, thus performing one or more methods in accordance with the corresponding one or more programs. At least one of the various functions of at least one in-vehicle unit 10 can be implemented as a hardware electronic circuit. For example, the various functions of at least one in-vehicle unit 10 can be implemented by a combination of electronic circuits including digital circuits, which include many logic gates, analog circuits, digital/analog hybrid circuits, or hardware/software hybrid circuits. The input unit 10c of each in-vehicle unit 10 enables a driver of the corresponding vehicle to enter various commands and/or various data items to the CPU 10a of the corresponding in-vehicle unit 10.

Similarly, the server 20 is configured mainly as at least one known microcomputer including a CPU, i.e. a processor, 20a and a memory device 20b. The memory device 20b includes, for example, at least one of semiconductor memories, such as a RAM, a ROM, and a flash memory. These semiconductor memories include at least one non-transitory computer-readable storage medium.

For example, the CPU 20a of the server 20 can run one or more programs, i.e. program instructions, stored in the memory device 20b, thus implementing various functions of the server 20 as software operations. In other words, the CPU 20a can run programs stored in the memory device 20b, thus performing one or more routines in accordance with the corresponding one or more programs. At least one of the various functions of the server 20 can be implemented as a hardware electronic circuit. For example, the various functions of at least one server 20 can be implemented by a combination of electronic circuits including digital circuits, which include many logic gates, analog circuits, digital/analog hybrid circuits, or hardware/software hybrid circuits.

Referring to FIG. 1, the in-vehicle unit 10 installed in each of the vehicles V1 to Vn includes a data obtainer 11 and a data transmitter 12.

As described above, the CPU 10a of the in-vehicle unit 10 runs corresponding one or more programs stored in the memory device 10b, thus implementing the functional modules 11 and 12.

The data obtainer 11 is communicably connected to sensors, i.e. in-vehicle sensors, SS installed in the corresponding vehicle. Note that the data obtainer 11 can include the in-vehicle sensors SS.

The in-vehicle sensors SS include a first type of sensors each repeatedly measuring a driving data item including at least one of 1. Operation data item D1 indicative of driver's operations of at least one of driver-operable devices installed in the corresponding vehicle 2. Behavioral data items D2 indicative of behaviors of the corresponding vehicle For example, the operation data items D1 include 1. The quantity or state of a driver's operation of a driver-operable accelerator pedal of the corresponding vehicle linked to a throttle valve 2. The quantity or state of a driver's operation of a driver-operable brake pedal of the corresponding vehicle linked to a hydraulic brake system (not shown) in the corresponding vehicle 3. The steering angle of the corresponding vehicle For example, the behavioral data items D2 include 1. The speed of the corresponding vehicle 2. The acceleration of the corresponding vehicle 3. The yaw rate of the corresponding vehicle The in-vehicle sensors SS can include a second type of sensors, such as a radar sensor, an image sensor, and a weather sensor, each repeatedly measuring a situation data item D3 that is useful in specifying a driving situation of the corresponding vehicle, which includes at least one of 1. An image data item including an image of a region, such as a front region, located around the corresponding vehicle captured by the image sensor, which is one of the second type of sensors, installed to the corresponding vehicle 2. A road attribute item indicative of the attribute of a road on which the corresponding vehicle is travelling, such as a straight road, a curved road, an expressway, and/or an ordinary road, which can be expressed from map data and the image data item 3. A current location data item indicative of the current location of the corresponding vehicle 4. Weather information indicative of a weather condition, such as a shine, i.e. fine condition, a cloudy condition, or a rain condition around the corresponding vehicle The data obtainer 11 obtains, from the first and second types of sensors, a driving data group including the operation data items D1, behavioral data items D2, and situation data items D3 in a predetermined measurement cycle. Then, the data obtainer 11 sequentially outputs, to the data transmitter 12, the driving data groups measured in the measurement cycle as target driving data sequences.

The data obtainer 11 also obtains an identification data item indicative of the type of at least one external factor that contributes to variations in the driving data items. The first embodiment uses, as the at least one external factor, the identity of a driver of the corresponding vehicle. That is, the type of the at least one external factor for each of the vehicles V1 to Vn represents a corresponding driver. Unique identification data (ID) items D4 are for example assigned to respective drivers that can use at least one of the vehicles V1 to Vn according to the first embodiment.

For example, when a driver uses one of the vehicles V1 to Vn, the driver operates the input unit 10c of the corresponding one of the in-vehicle units 10c to thereby enter the driver's ID data item D4 to the CPU 10a, and the CPU 10a stores the entered driver's ID data item D4 in the memory device 10b.

As another example, unique ID data items can be assigned to respective keys prepared for each of the vehicles V1 to Vn, and when a driver inserts an assigned key for one of the vehicles V1 to Vn into an ignition lock of one of the vehicles V1 to Vn, the CPU 10a, which is communicable with the ignition lock, reads the ID data item assigned to the inserted key.

As a further example, ID data items of drivers who have the authority to use a selected vehicle in the vehicles V1 to Vn are recorded beforehand in the memory device 10b of the in-vehicle unit 10 of the selected vehicle. Then, when a driver who has the authority to use the selected vehicle enters information about him or her, the CPU 10a can receive the information, and extract one of the recorded ID data items; the extracted ID data item matches with the entered information.

The data obtainer 11 outputs, to the data transmitter 12, the ID data item of a current driver of the corresponding vehicle.

The data transmitter 12 is configured to
(1) Receive the target driving data sequences and the ID data item output from the data obtainer 11
(2) Transmit the target driving data sequences and the ID data item to the server 20.

The data transmitter 12 can be configured to indirectly transmit the target driving data sequences and the ID data item to the server 20 via infrastructures provided on, for example, roadsides. The data transmitter 12 can be comprised of a mobile communicator, such as a cellular phone, which can communicate with the server via radio communication networks.

The server 20 serves as a fixed station directly communicable or indirectly communicable via infrastructures or the radio communication networks with the vehicles V1 to Vn, i.e. their in-vehicle devices 10.

Referring to FIG. 1, the server 20 includes a data collector 21, a driving data database (DB) 22, a model generator 23, a data extractor 24, an analytical data DB 25, and an analyzing unit 26. As described above, the CPU 20a of the server 20 executes one or more corresponding programs stored in the memory device 20b, thus implementing the functional modules 21, 23, 24, and 26. The memory device 20b can include predetermined storage areas allocated to serve as the respective driving data DB 22 and analytical data DB 25, or include at least one mass storage, such as a semiconductor memory or a magnetic memory, such as a hard disk drive, that serves as the driving data DB 22 and analytical data DB 25.

The data collector 21 collects the target driving data sequences and the ID data item output from each of the in-vehicle devices 10, and stores, in the driving data DB 22, the collected target driving data sequences and ID data item for each of the in-vehicle devices 10 such that the collected target driving data sequences for each of the in-vehicle devices 10 are correlated with the ID data item for the corresponding in-vehicle device 10.

The target driving data sequences include sequential sets of the operational data items D1, the behavior data items D2, and the situation data items D3. That is, at time (t−1), a set of the operational data items D1, the behavior data items D2, and the situation data items D3, which are obtained by the data obtainer 11, is collected by the data collector 12. After the lapse of one measurement cycle since the time (t−1), a next set of the operational data items D1, the behavior data items D2, and the situation data items D2, and the situation data items D3, which are obtained by the data obtainer 11, is collected by the data collector 12 at time t. After the lapse of one measurement cycle since the time t, a next set of the operational data items D1, the behavior data items D2, and the situation data items D3, which are obtained by the data obtainer 11, is collected by the data collector 12 at time (t+1).

The data collector 12 is configured to transform these data items D1 to D3 obtained at time t such that they are expressed as a multidimensional target vector $x_t$ in which these data items D1 to D3 are arranged as its elements in a predetermined order. That is, if data items X1, X2, ..., XK are obtained as the data items D1 to D3 at the time t, the multidimensional target vector $x_t$ is expressed as the following equation $x_t = (X1, X2, \ldots, XK)$. That is, the target vectors $x_t$ (t=1, 2, ... ) represent target vector sequences.

Specifically, in the driving data DB 22, the target vector sequences are stored.

The data collector 12 is also configured to transform the ID data item for each of the vehicles V1 to Vn, i.e. each of the drivers, into a multidimensional target vector whose elements are each have 0 or 1; the number of dimensions of the multidimensional target vector corresponds to the number of drivers of the respective vehicles V1 to Vn. For example, if the number of vehicles V1 to Vn is four, so that the number of drivers is four, the respective ID data items are expressed as an identification vector b1 (1, 0, 0, 0), an identification vector b2 (0, 1, 0, 0), an identification vector b3 (0, 0, 1, 0), and an identification vector b4 (0, 0, 0, 1). That is, any one of the drivers can be expressed as an identification vector bd in which d identifies any one of the drivers.

The model generator 23 is configured to for example perform, every regular internal or irregular interval, a training task that
(1) Captures the target vector sequences for all the in-vehicle devices 10
(2) Trains a feature model 30, such as a data compression model or a dimensionality reduction model, in accordance with the target vector sequences to thereby generate a trained feature model 30

Figure 2:
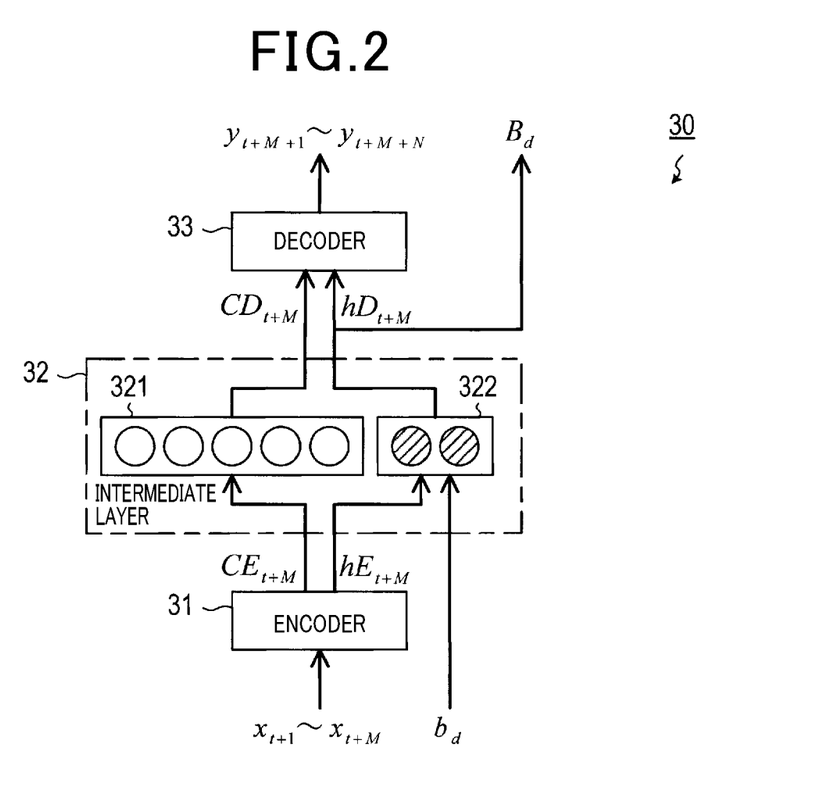
FIG. 2 is a block diagram schematically illustrating an example of the internal structure of a feature model according to the first embodiment.

Referring to FIG. 2, the feature model 30 includes an encoder 31, an intermediate layer, i.e. a driver translation layer, 32, and a decoder 33. That is, the feature model 30 is designed as a neural network comprised of a common encoder-decoder model to which the intermediate layer (driver translation layer) 32 has been added.

In the encoder-decoder mode, the encoder 31 is configured to extract latent features, i.e. essential features, from actual input data, and the decoder 33 is configured to use the extracted latent features to thereby reconstruct or predict input data. As each of the encoder 31 and the decoder 33, a long short term memory (LSTM) layer, which is one type of recurrent neural networks (RNN), is used in the first embodiment. Because the LSTM layer is a known technology, the detailed descriptions of this are omitted.

Note that the LSTM layer has a memory cell, and the state of the memory cell, which will be referred to as a cell state, and an output in the LSTM layer of the encoder 31 at time t will be respectively expressed as $CE_t$ and $hE_t$. Similarly, the cell state and output in the LSTM layer of the decoder 33 at time t will be respectively expressed as $CD_t$ and $hD_t$. Note that each of the cell state $CE_t$ and output $hE_t$ shows latent features of the input target vector at time t.

Figure 3:
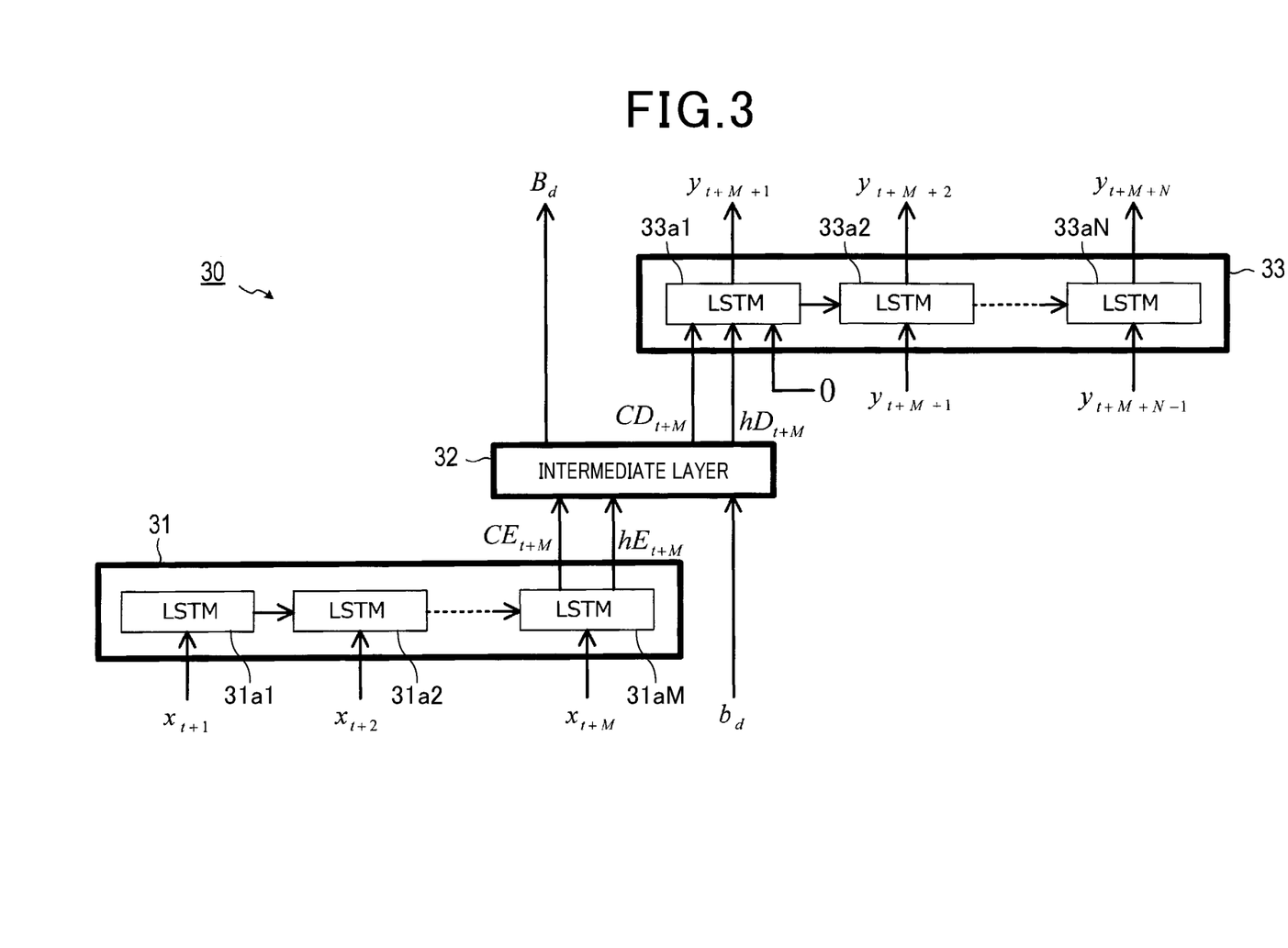
FIG. 3 is a block diagram schematically illustrating an example of how each of an encoder and a decoder of the individual network illustrated in FIG. 2 is operated.

As illustrated in FIG. 3, the encoder 31 includes a single LSTM layer comprised of sequentially connected LSTM nodes 31a1 to 31aM. Note that, in order to easily understand the operations of the encoder 31, the single LSTM layer is comprised of the temporally developed LSTM nodes 31a1 to 31aM.

When M target vectors $x_{t+1}$ to $x_{t+M}$, i.e. measured driving data items, obtained within a specified input period from time (t+1) to time (t+M) inclusive are sequentially input to the encoder 31, the first LSTM node 31a1 generates the cell state $CE_{t+1}$ and output $hE_{t+1}$ in accordance with the target vector $x_{t+1}$ when the target vector $x_{t+1}$ is input thereto, and supplies the cell state $CE_{t+1}$ and output $hE_{t+1}$ to the next LSTM node 31a2. For example, as described above, the interval between the time (t+k) and to the time (t+k+1) adjacent thereto is set to one measurement cycle; k is any positive integer including zero.

Similarly, the second LSTM node 31a2 generates the cell state $CE_{t+2}$ and output $hE_{t+2}$ in accordance with the cell state $CE_{t+1}$, output $hE_{t+1}$, and target vector $x_{t+2}$ when the target vector $x_{t+2}$ is input thereto, and supplies the cell state $CE_{t+2}$ and output $hE_{t+2}$ to the next LSTM node 31a3.

That is, when the target vector $x_{t+M}$ is input to the M-th LSTM node 31aM, the M-th LSTM node 31aM generates the cell state $CE_{t+M}$ and output $hE_{t+M}$ in accordance with the cell state $CE_{t+M-1}$, output $hE_{t+M-1}$, and target vector $x_{t+M}$, and supplies the cell state $CE_{t+M}$ and output $hE_{t+M}$ to the intermediate layer 32.

In other words, when the M target vectors $x_{t+1}$ to $x_{t+M}$ are sequentially input to the encoder 31, the encoder 31 encodes the M target vectors $x_{t+1}$ to $x_{t+M}$ to thereby output, as encoded, i.e. compressed, data item, the cell state $CE_{t+M}$ and output $hE_{t+M}$. The number of dimensions of each of the cell state $CE_{t+M}$ and output $hE_{t+M}$ is smaller than the number of the multidimensional target vectors $x_{t+1}$ to $x_{t+M}$, so that each of the cell state $CE_{t+M}$ and output $hE_{t+M}$ represents the latent features, i.e. common important features, included in the multidimensional target vectors $x_{t+1}$ to $x_{t+M}$.

Figure 8:
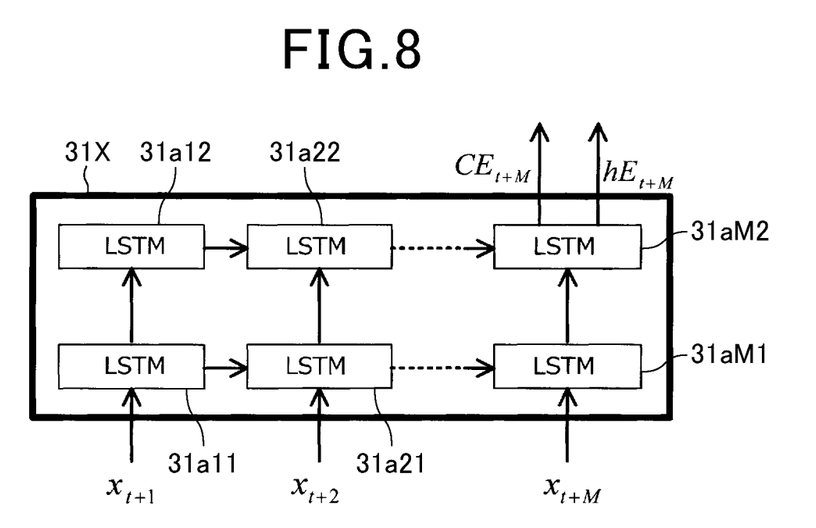
FIG. 8 is a block diagram schematically illustrating multi LSTM layers if an encoder comprised of the multi LSTM layers.

In addition, the encoder 31 can be comprised of multi LSTM layers. For example, FIG. 8 schematically illustrates an example of an encoder 31X having such a multi LSTM layers. Specifically, FIG. 8 illustrates a first layer of LSTM nodes 31a11 to 31aM1 that are sequentially connected to which the M target vectors $x_{t+1}$ to $x_{t+M}$ are respectively input. FIG. 8 also illustrates a second layer of LSTM nodes 31a12 to 31aM2 that are sequentially connected, and are respectively connected to the LSTM nodes 31a11 to 31aM1. That is, the LSTM node 31aM2 supplies, based on the cell state and output sent from the LSTM node 31a(M−1)2 and the cell state and output sent from the LSTM node 31aM1, the cell state $CE_{t+M}$ and output $hE_{t+M}$ to the intermediate layer 32.

Referring to FIG. 2, the intermediate layer 32 is configured as, for example, a neural network to which the cell state $CE_{t+M}$ and output $hE_{t+M}$ sent from the encoder 31, and the identification vector bd.

Specifically, the intermediate layer 32 is comprised of two partial networks, that is, a common network 321 and an individual network 322.

The common network 321 is configured to receive the cell state $CE_{t+M}$, and output, to the decoder 33, the cell state $CE_{t+M}$, i.e. the latent features included in the target vectors $x_{t+1}$ to $x_{t+M}$, without change as an initial cell state $CD_{t+M}$ for the decoder 33.

The individual network 322 includes a single dense layer, i.e. a single fully connected layer, or multiple dense layers, i.e. multiple fully connected layers.

Note that, in the feature model 30, parameters, which include, for example, connection weights and/or connection biases, between nodes of the different layers, and parameters of the LSTM layer, have been trained and can be repeatedly trained to increase the analysis accuracy of the driving data analyzer 1. How to train the parameters included in the feature model 30 will be described later.

Specifically, the individual network 322 merges the output $hE_{t+M}$, i.e. the latent features included in the target vectors $x_{t+1}$ to $x_{t+M}$, with the identification vector bd to thereby output a merged result indicative of the latent features included in the target vectors $x_{t+1}$ to $x_{t+M}$, which are correlated with the identification vector bd.

The merged result or its part is input to the decoder 33 as the initial cell state $CD_{t+M}$ for the decoder 33, and the merged result or its remaining part is output as a latent feature vector Bd of the driver specified by the identification vector bd.

Although the single or multiple dense layers are used as the individual network 322, a merge network configured to merge the output $hE_{t+M}$ with the identification vector bd in accordance with a predetermined rule can be used as the individual network 322.

As illustrated in FIG. 3, the decoder 33 for example includes a single LSTM layer comprised of sequentially connected LSTM nodes 33a1 to 33aN. Note that, in order to easily understand the operations of the decoder 33, the single LSTM layer is comprised of the temporally developed LSTM nodes 33a1 to 33aN. To the first LSTM 33a1, the cell state $CD_{t+M}$ and the output $hE_{t+M}$ are provided as initial values. In addition, an initial value of 0 is input to the first LSTM 33a1 as its input.

When the cell state $CD_{t+M}$, the output $hE_{t+M}$, and the initial value of 0 are input to the first LSTM 33a1, the decoder 33 performs a decoding operation N times to thereby sequentially output predicted sequential vectors $y_{t+M+1}$ to $y_{t+M+N}$ within a specified prediction period from the time (t+M+1) to time (t+M+N) that sequentially follow the specified input period from the time (t+1) to the time (t+M).

Specifically, based on the cell state $CD_{t+M}$, output $hD_{t+M}$, and the input of the initial value of 0, the first LSTM node 33a1 generates, at the first decoding operation, (1) The cell state $CD_{t+M+1}$ and the output $hD_{t+M+1}$
(2) The predicted sequential vector $y_{t+M+1}$ Then, the first LSTM node 33a1 supplies the cell state $CD_{t+M+1}$ and the output $hD_{t+M+1}$ to the next LSTM node 33a2, and also supplies the predicted sequential vector $y_{t+M+1}$ to the next LSTM node 33a2 as its input.

Similarly, based on the cell state $CD_{t+M+1}$, output $hD_{t+M+1}$, and the input of the predicted sequential vector $y_{t+M+1}$, the second LSTM node 33a2 generates, at the second decoding operation, (1) The cell state $CD_{t+M+2}$ and the output $hD_{t+M+2}$
(2) A predicted sequential vector $y_{t+M+2}$ Then, the second LSTM node 33a2 supplies the cell state $CD_{t+M+2}$ and the output $hD_{t+M+2}$ to the next LSTM node 33a3, and also supplies the predicted sequential vector $y_{t+M+2}$ to the next LSTM node 33a3 as its input.

The third LSTM node 33a3 to the (N−1)-th LSTM node 33a(N−1) sequentially perform their decoding operations in the same manner as the first or second LSTM node 33a1.

Then, based on the cell state $CD_{t+M+N-1}$, output $hD_{t+M+N-1}$, and the input of the predicted sequential vector $y_{t+M+N-1}$, the N-th LSTM node 33aN generates, at the N-th decoding operation, (1) The cell state $CD_{t+M+N}$ and the output $hD_{t+M+N}$
(2) A predicted sequential vector $y_{t+M+N}$ The N-th LSTM node 33aN outputs the predicted sequential vector $y_{t+M+N}$. In other words, when the cell state $CD_{t+M}$, output $hD_{t+M}$, and the input of the initial value of 0 are input to the decoder 33, the decoder 33 is configured to decode the cell state $CD_{t+M}$, output $hD_{t+M}$, and the input of the initial value of 0 into the predicted sequential vectors $y_{t+M+1}$ to $y_{t+M+N}$ in response to the input data sequential vectors $x_{t+1}$ to $x_{t+M}$.

Note that the features of the predicted sequential vector $y_{t+M+1}$ output from the first LSTM node 33a1 are embedded in the latent features $CD_{t+M+2}$ and $hD_{t+M+2}$ of the second LSTM node 33a1, the features of the predicted sequential vector $y_{t+M+2}$ output from the second LSTM node 33a2 are embedded in the latent features $CD_{t+M+3}$ and $hD_{t+M+3}$ of the third LSTM node 33a3, . . . , and the features of the predicted sequential vector $y_{t+M+N-1}$ output from the (N-1-th LSTM node 33a(N-1) are embedded in the latent features $CD_{t+M+N}$ and $hD_{t+M+N}$ of the N-th LSTM node 33aN Like the encoder 31, the decoder 33 can be comprised of multi LSTM layers.

Next, the following describes how the model generator 23 trains the feature model 30 if the feature model 30 has been untrained or if it is determined that the feature model 30 should be trained.

First, the feature model generator 23 generates, based on the target driving data sequences, i.e. target vector sequences, stored in the driving data DB 22, training data items for the individual drivers, i.e. for the individual in-vehicle devices 10, and supervised data items that are respectively paired to the training data items.

Figure 9:
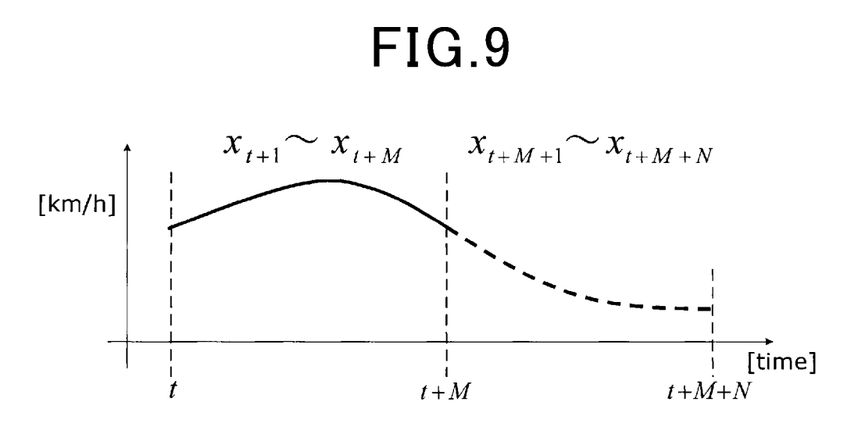
FIG. 9 is a graph schematically illustrating an example of a training data sequence.

Specifically, as illustrated in FIG. 9, the feature model generator 23 reads, from the driving data DB 22, the target vectors $x_{t+1}$ to $x_{t+M}$ obtained within the specified period from the time (t+1) to the time (t+M) inclusive for each driver used as the training data items. Next, the feature model generator 23 reads, from the driving data DB 22, the target vectors $x_{t+M+1}$ to $x_{t+M+N}$ obtained within the specified period from the time (t+M+1) to the time (t+M+N) inclusive for each driver used as the supervised data items.

Note that the number N is for example set to be equal to the number M, but can be set to be different from the number M. FIG. 9 merely illustrates how vehicle's speed as an element of the target vectors varies over time, each of the other driving data items varies a corresponding element of the target vectors.

Then, the feature generator 23 trains the feature model 30 using the training data items and the supervised data items that are respectively paired to the training data items.

Specifically, the feature generator 23 performs a training task of (1) Inputting the training data items $x_{t+1}$ to $x_{t+M}$ to the encoder 31 of the feature model 30, so that the decoder 33 of the feature model 30 outputs the predicted sequential vectors $y_{t+M+1}$ to $y_{t+M+N}$.

(2) Calculating the square of the difference between each element of the supervised data items $x_{t+M+1}$ to $x_{t+M+N}$ and the corresponding element of the predicted sequential vectors $y_{t+M+1}$ to $y_{t+M+N}$.

(3) Calculating the sum of the calculated squares of the respective differences as a square error Thereafter, the feature generator 23 repeats the training task while changing values of the parameters of the feature model 30 until the square error calculated for the current training task has reached a predetermined minimum value. This enables the parameters of the feature model 30 to be trained.

Specifically, the feature generator 23 repeats the training task for the single neutral network comprised of the encoder 31, the intermediate layer 32, and the decoder 33 of the feature model 30 while changing values of all the parameters of the single neural network until the square error calculated for the current training task has reached a predetermined minimum value. This enables all the parameters of the feature model 30 to be collectively trained.

The training algorithm for training the feature model 30 schematically described above is, what is called a back propagation through time (BPIT) algorithm, but the training algorithm for training the feature model 30 is not limited to the BPIT algorithm.

The feature generator 23 can be configured to perform a known sliding window algorithm for the target driving data sequences, i.e. target vector sequences stored in the driving data DB 22, to thereby extract training data items and supervised data items that are respectively paired to the training data items. Then, the feature generator 23 can be configured to use the pairs of the training data items and supervised data items as a training data set.

The above training enables the feature model 30 to predict, based on the target vectors obtained within the period (M×T), target vectors within the period (N×T) that follows the period (M×T) when the measurement cycle is represented by T; the measurement cycle T in the first embodiment is for example set to 1 seconds hereinafter.

This training of the feature model 30 enables (1) The cell state $CD_{t+M}$, which represents the latent features included in the target vectors $x_{t+1}$ to $x_{t+M}$ and stored in the common network 321, to be trained (2) The output $hE_{t+M}$, which represents the latent features for each driver included in the target vectors $x_{t+1}$ to $x_{t+M}$ and stored in the individual network 322, to be trained.

The data extractor 24, which serves as, for example, a feature extractor, is configured to extract, from the collected target driving data sequences, analytical data based on the feature model 30 generated, i.e. trained, by the model generator 23; the analytical data is used for the analyzing unit 26 to analyze various phenomena or events associated with driving. Then, the data extractor 24 is configured to store the analytical data in the analytical data DB 25.

The following describes how the data extractor 24 extracts, from the collected target driving data sequences, the analytical data using, for example, the following approaches.

I. First Approach

When the target driving data items, i.e. target vectors, $x_{t+1}$ to $x_{t+M}$ within a specified period (M×T) and a specified identification vector bd are input to the feature model 30, the data extractor 24 extracts, as the analytical data, first common analytical data including the cell state $CD_{t+M}$, which is output from the common network 321 of the intermediate layer 32 as a result of the input of the target vectors $x_{t+1}$ to $x_{t+M}$ and the specified identification vector bd to the feature model 30.

That is, the extracted common analytical data represents the latent features of the collected target driving data sequences; the latent features are independent from drivers.

II. Second Approach

When the target driving data items, i.e. target vectors, $x_{t+1}$ to $x_{t+M}$ within a specified period (M×T) and an identification vector bd indicative of any driver are input to the feature model 30, the data extractor 24 extracts, as the analytical data, second common analytical data including the predicted sequential vectors $y_{t+M+1}$ to $y_{t+M+N}$ within the specified prediction period from the time (t+M+1) to the time (t+M+N), which are output from the decoder 33 as a result of the input of the target vectors $x_{t+1}$ to $x_{t+M}$ and the specified identification vector bd to the feature model 30. That is, the extracted second common analytical data represents the latent features of the collected target driving data sequences; the latent features are independent from drivers.

For example, setting each element of the identification vector bd to 0 or 1 enables any driver to be specified. That is, because setting each element of the identification vector bd to 0 represents that no drivers are specified, and setting each element of the identification vector bd to 1 represents that all drivers are specified, this means that a particular driver is not specified, in other words, that any driver is specified.

Note that, because the analytical data extracted by the first approach shows the latent features themselves, it may be difficult for a user of the driving data analyzer 1 to intuitively understand what the analytical data means.

In contrast, because the analytical data extracted by the second approach shows specific driving data items, i.e. data items dependent on specific driving behaviors themselves, it is easy for a user of the driving data analyzer 1 to intuitively understand what the analytical data mean.

III. Third Approach

When the target driving data items, i.e. target vectors, $x_{t+1}$ to $x_{t+M}$ within a specified input period (M×T) and an identification vector bd indicative of a particular driver are input to the feature model 30, the data extractor 24 extracts, as the analytical data, the predicted sequential vectors $y_{t+M+1}$ to $y_{t+M+N}$ within the specified prediction period from the time (t+M+1) to the time (t+M+N), which are output from the decoder 33 as a result of the input of the target vectors $x_{t+1}$ to $x_{t+M}$ and the identification vector bd to the feature model 30.

Figure 4:
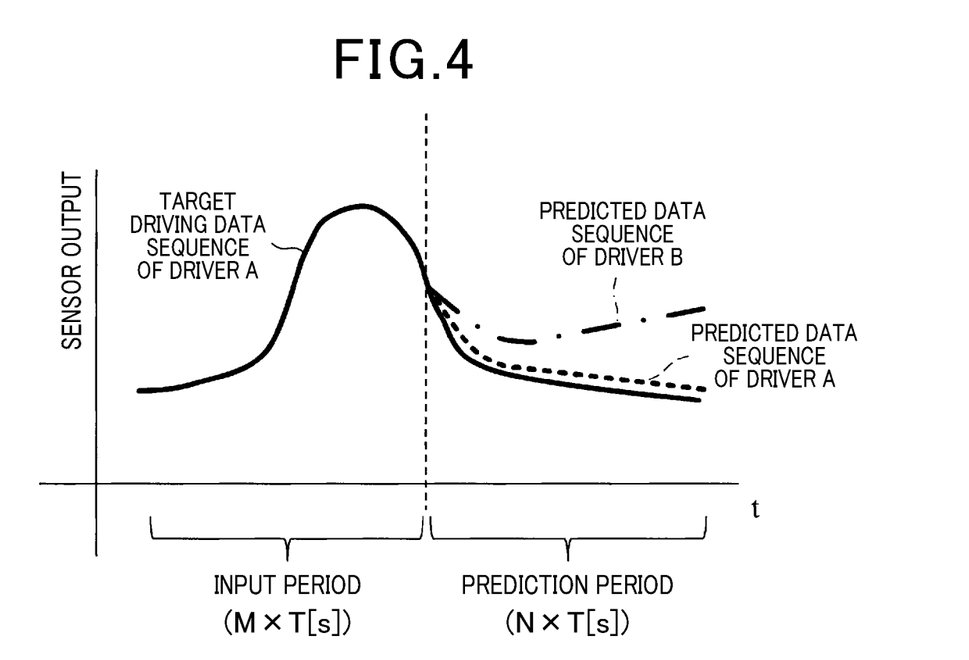
FIG. 4 is a graph schematically illustrating an example of relationships among a target driving data sequence of a driver, a predicted data sequence of another driver, and a predicted data sequence of the former driver thereamong.

If the identification vector bd represents a driver correlated with the target driving data items, i.e. target vectors, $x_{t+1}$ to $x_{t+M}$, which will be referred to as a target driver (driver A in FIG. 4), the data extractor 24 enables the extracted predicted sequential vectors $y_{t+M+1}$ to $y_{t+M+N}$, which show a predicted future behavior of the target driver A and/or a predicted future behavior of the vehicle corresponding to the target driver A within the future prediction period (N×T), to be obtained (see dashed curve in FIG. 4).

In contrast, if the identification vector bd represents a driver who is not correlated with the target driving data items, i.e. target vectors, $x_{t+1}$ to $x_{t+M}$, which will be referred to as a non-target driver (driver B in FIG. 4), the data extractor 24 enables the extracted predicted sequential vectors $y_{t+M+1}$ to $y_{t+M+N}$, which show a predicted future behavior of the non-target driver B and/or a predicted future behavior of the vehicle corresponding to the non-target driver B within the future prediction period (N×T), to be obtained (see dot-and-dash curve in FIG. 4).

That is, even if there are no target driving data items, i.e. target vectors, of a specified driver on which the data extractor 24 focuses in a driving situation, the data extractor 24 is capable of obtaining predicted driving data items for the specified driver upon there are target data items for another driver. Note that, in FIG. 4, solid curve represents the target data items of the target driver.

The analyzing unit 26, which serves as, for example, a data analyzer, is configured to execute, based on the analytical data stored in the analytical data DB 25, various analytical tasks that analyze information included in the target driving data items, i.e. target vectors. The analyzing unit 26 can be configured to analyze other common statistical tasks for the target driving data items, i.e. target vectors, in accordance with the analytical data stored in the analytical data DB 25.

For example, the analyzing unit 26 can be configured to analyze, based on the first or second common analytical data, the target driving data items, i.e. target vectors, to correspondingly extract driving scenes each representing similar driving situations, thus performing driver's driving assist in accordance with each of the driving scenes. This driving scene extracting task is disclosed in Japanese Patent Application Publication No. 2013-250663 or US patent Publication U.S. Pat. No. 9,527,384. The disclosure of each of patent Publications U.S. Pat. No. 9,527,384 and JP 2013-250663 is incorporated entirely herein by reference.

This driving scene extracting task therefore reduces cases where, although different drivers travel the same type of vehicle on the same road, the driving scenes for the different drivers are extracted as different driving scenes due to, for example, the difference between their driving habits. This results in an improvement of the accuracy of analyzing the driving scenes.

As another example, the analyzing unit 26 can be configured to extract, as the analytical data, target driving data items for all the drivers in a specified driving situation, and execute, for example, a common statistical task that analyzes the driving behavior of each driver in the same specified driving situation.

The driving data analyzer 1 according to the first embodiment described in detail above obtains the following technical benefits.

Specifically, the driving data analyzer 1 is configured to extract, from the collected target driving data items of the drivers, common feature data that represents at least one latent feature included in the collected target driving data items using the feature model 30; the at least latent feature is at least one common feature being latent in the collected target driving data items independently from the drivers. Then, the driving data analyzer 1 is configured to analyze, based on the common feature data, at least information included in the collected target driving data items. This therefore enables a robust analyzed result, which is independent from the drivers, to be obtained.

Additionally, the driving data analyzer 1 is configured to use, as the feature model 30, a neural network comprised of the encoder 31, the intermediate layer 32 linked to the encoder 31, and the decoder 33 linked to the intermediate layer 32, in other words, comprised of a common encoder-decoder model to which the intermediate layer 32 has been added. The intermediate layer 32 is comprised of the common network 321 and the individual network 322.

The common network 321 is configured to (1) Receive the cell state $CE_{t+M}$, which is part of the output information from the encoder 31 and represents the latent features included in the target driving data items (2) Output, to the decoder 33, the cell state $CE_{t+M}$ without change.

The individual network 322 is configured to (1) Merge the output $hE_{t+M}$, which represents the latent features included in the target driving data items and is another part of the output information from the encoder 31, with the identification vector bd (2) Supply, to the decoder 33, the merged result Training of the neural network based on a known training approach therefore enables the latent features independent from the drivers to be stored in the common network 321, and the latent features for each driver to be stored in the individual network 322.

The driving data analyzer 1 makes it possible to predict, from the collected driving data items for a specified driver indicated by the identification vector bd, a future behavior of the specified driver using the feature model 30.

For example, even if the identification vector bd represents a driver who is not correlated with the target driving data items to be called as a non-target driver, the driving data analyzer 1 makes it possible to predict a future behavior of the non-target driver using the feature model 30. This therefore enables the target driving data items for all the drivers to be mutually compared with each other to thereby analyze the compared results.

Second Embodiment

Figure 5:
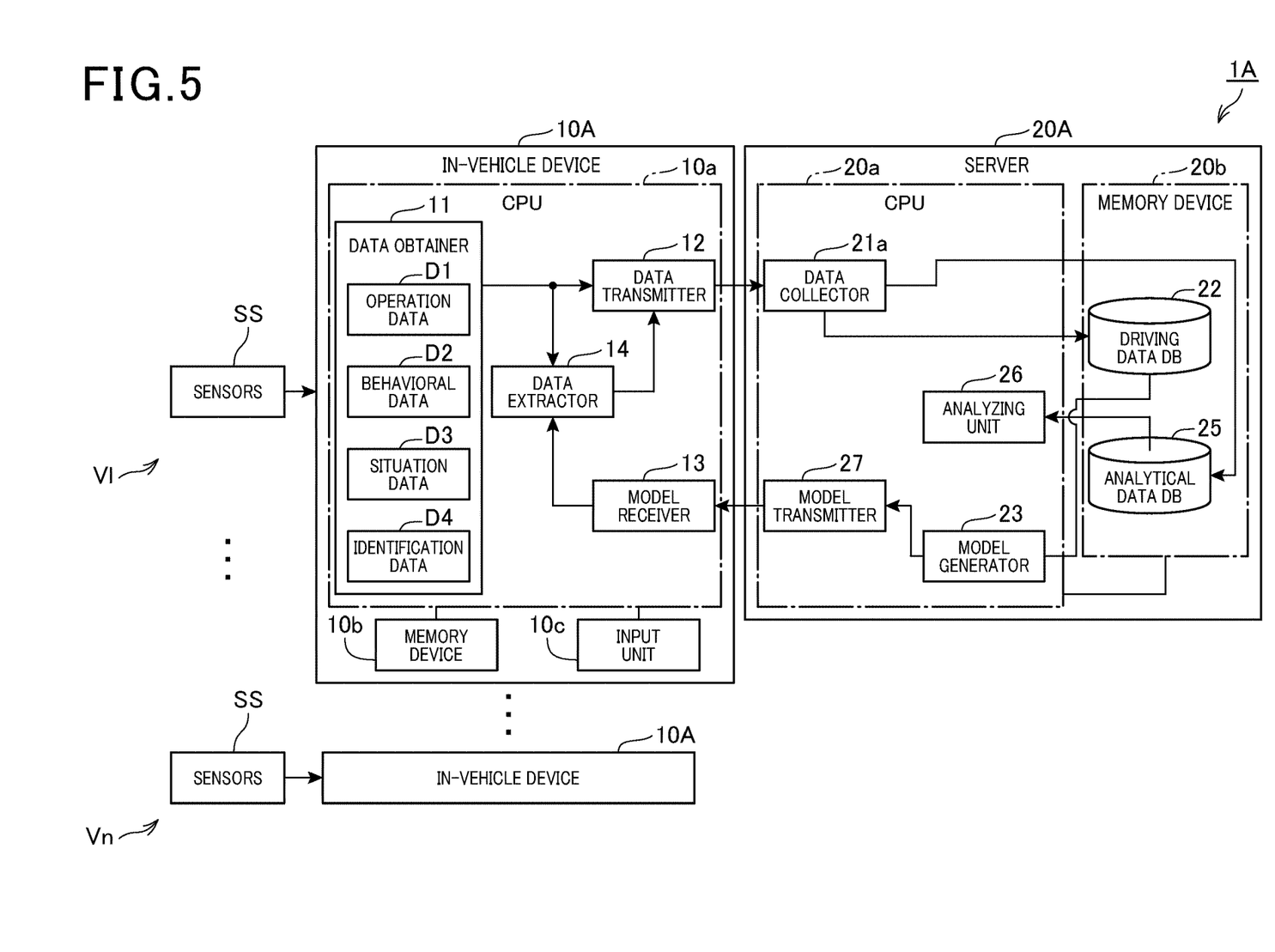
FIG. 5 is s a block diagram schematically illustrating an example of the functional structure of a driving data analyzer according to the second embodiment of the present disclosure.

The following describes the second embodiment of the present disclosure with reference to FIG. 5. A driving data analyzer 1A according to the second embodiment differs from the driving data analyzer 1 in the following points. So, the following mainly describes the different points of the driving data analyzer 1A according to the second embodiment, and omits or simplifies descriptions of like parts between the first and second embodiments, to which identical or like reference characters are assigned, thus eliminating redundant description.

The first embodiment is configured such that the server 20 generates the analytical data, but the second embodiment is configured such that each in-vehicle device 10A generates the analytical data.

Referring to FIG. 5, the driving data analyzer 1A includes the in-vehicle units 10A respectively installed in the vehicles V1, . . . , Vn, and a server 20A communicable by radio with the in-vehicle units 10A.

The in-vehicle unit 10A installed in each of the vehicles V1 to Vn includes the data obtainer 11, a data transmitter 12a, a model receiver 13, and a data extractor 14.

The server 20A includes a data collector 21a, the driving data DB 22, the model generator 23, the analytical data DB 25, the analyzing unit 26, and a model transmitter 27.

The model transmitter 27 is configured to cyclically or periodically transmit, i.e. broadcast, to each in-vehicle device 10A, the feature model 30 each time the training of the feature model 30 is completed.

The model receiver 13 of each in-vehicle device 10A is configured to receive the feature model 30 each time the feature model 30 is transmitted from the server 20A.

The data extractor 14 is configured to extract, from the collected target driving data sequences, analytical data based on the feature model 30 received by the model receiver 13; the analytical data is used for the analyzing unit 26 of the server 20A to analyze various phenomena or events associated with driving. The extraction task performed by the data extractor 14 is substantially identical to the extraction task performed by the data extractor 24 according to the first embodiment.

The data transmitter 12a is configured to
(1) Receive the target driving data sequences and the ID data item output from the data obtainer 11
(2) Transmit the target driving data sequences and the ID data item to the server 20
(3) Receive the analytical data extracted by the data extractor 14
(4) Transmit the analytical data to the server 20A The data collector 21a of the server 20A is configured to
(1) Collect the target driving data sequences the ID data item, and the analytical data output from each of the in-vehicle devices 10A
(2) Store, in the driving data DB 22, the collected target driving data sequences and ID data item for each of the in-vehicle devices 10A such that the collected target driving data sequences for each of the in-vehicle devices 10A correlated with the ID data item for the corresponding data obtainer 11
(3) Store the analytical data in the analytical data DB As described above, the driving data analyzer 1A according to the second embodiment described in detail above obtains the following technical benefit in addition to the above technical benefits obtained by the first embodiment.

Specifically, the driving data analyzer 1A is configured such that each in-vehicle device 10A extracts, from the collected target driving data sequences, the analytical data, making it possible to reduce the processing load of the server 20A.

Third Embodiment

Figure 6:
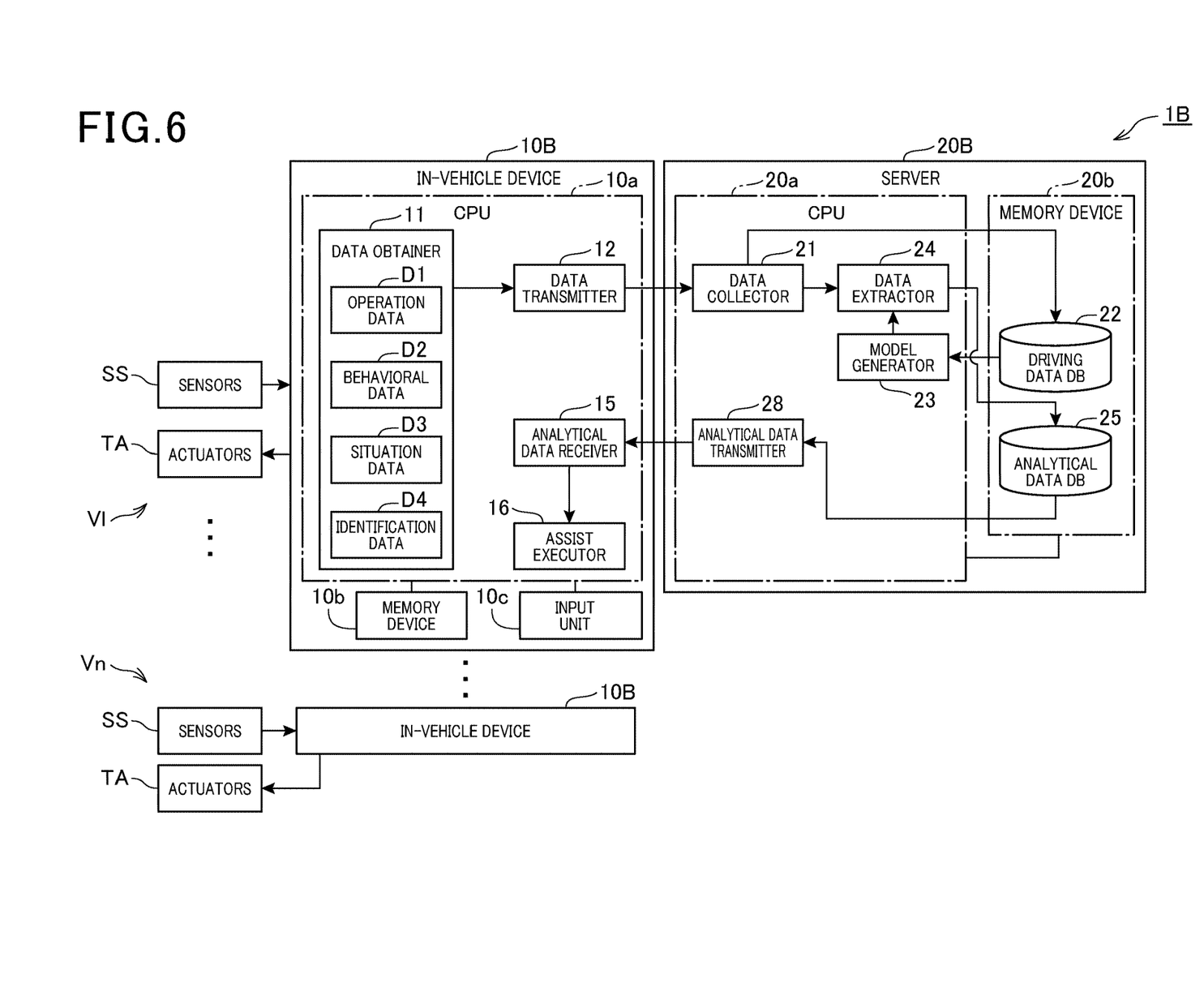
FIG. 6 is a block diagram schematically illustrating an example of the functional structure of a driving data analyzer according to the third embodiment of the present disclosure.

The following describes the third embodiment of the present disclosure with reference to FIG. 6. A driving data analyzer 1B according to the third embodiment differs from the driving data analyzer 1 in the following points. So, the following mainly describes the different points of the driving data analyzer 1B according to the third embodiment, and omits or simplifies descriptions of like parts between the first and third embodiments, to which identical or like reference characters are assigned, thus eliminating redundant description.

The first embodiment is configured such that the analyzing unit 26 of the server 20 executes, based on the analytical data stored in the analytical data DB 25, various analytical tasks that analyze information included in the target driving data items, i.e. target vectors.

In contrast, the third embodiment is configured such that
(1) A server 20B transmits the analytical data to each in-vehicle device 10B
(2) Each in-vehicle device 10B performs various cruise assist tasks, i.e. various driving assist tasks, in accordance with the analytical data Referring to FIG. 6, the driving data analyzer 1B includes the in-vehicle units 10B respectively installed in the vehicles V1, . . . , Vn, and the server 20B communicable by radio with the in-vehicle units 10B.

The in-vehicle unit 10B installed in each of the vehicles V1 to Vn includes the data obtainer 11, an analytical data receiver 15, and a driving assist executor 16.

The server 20B includes the data collector 21, the driving data DB 22, the model generator 23, the data extractor 24, the analytical data DB 25, and an analytical data transmitter 28 in place of the analyzing unit 26.

The analytical data transmitter 28 is configured to transmit, i.e. broadcast, to each in-vehicle device 10B, the analytical data stored in the analytical data DB 25.

The analytical data receiver 15 of each in-vehicle device 10B is configured to receive the analytical data.

The driving assist executor 16 of each in-vehicle device 10B is configured to
(1) Predict a future behavior of the driver and/or a future behavior of the corresponding vehicle
(2) Execute, based on the future behavior of the driver and/or the future behavior of the corresponding vehicle, at least one of the various driving assist tasks to control at least one of target actuators TA installed in the corresponding vehicle, such as a steering motor, a driving motor if the corresponding vehicle is a hybrid vehicle or an electrical vehicle, a throttle valve, a brake actuator for each wheel, and/or a warning device This at least one of the various driving assist tasks enables the corresponding vehicle to be safely travelled.

As described above, the driving data analyzer 1B according to the second embodiment described in detail above obtains the following technical benefit in addition to the above technical benefits obtained by the first embodiment.

Specifically, the driving data analyzer 1B is configured such that each in-vehicle device 10B executes, based on the future behavior of the driver and/or the future behavior of the corresponding vehicle, at least one of the various driving assist tasks. This results in an improvement of the driving safety of each vehicle.

Fourth Embodiment

Figure 7:
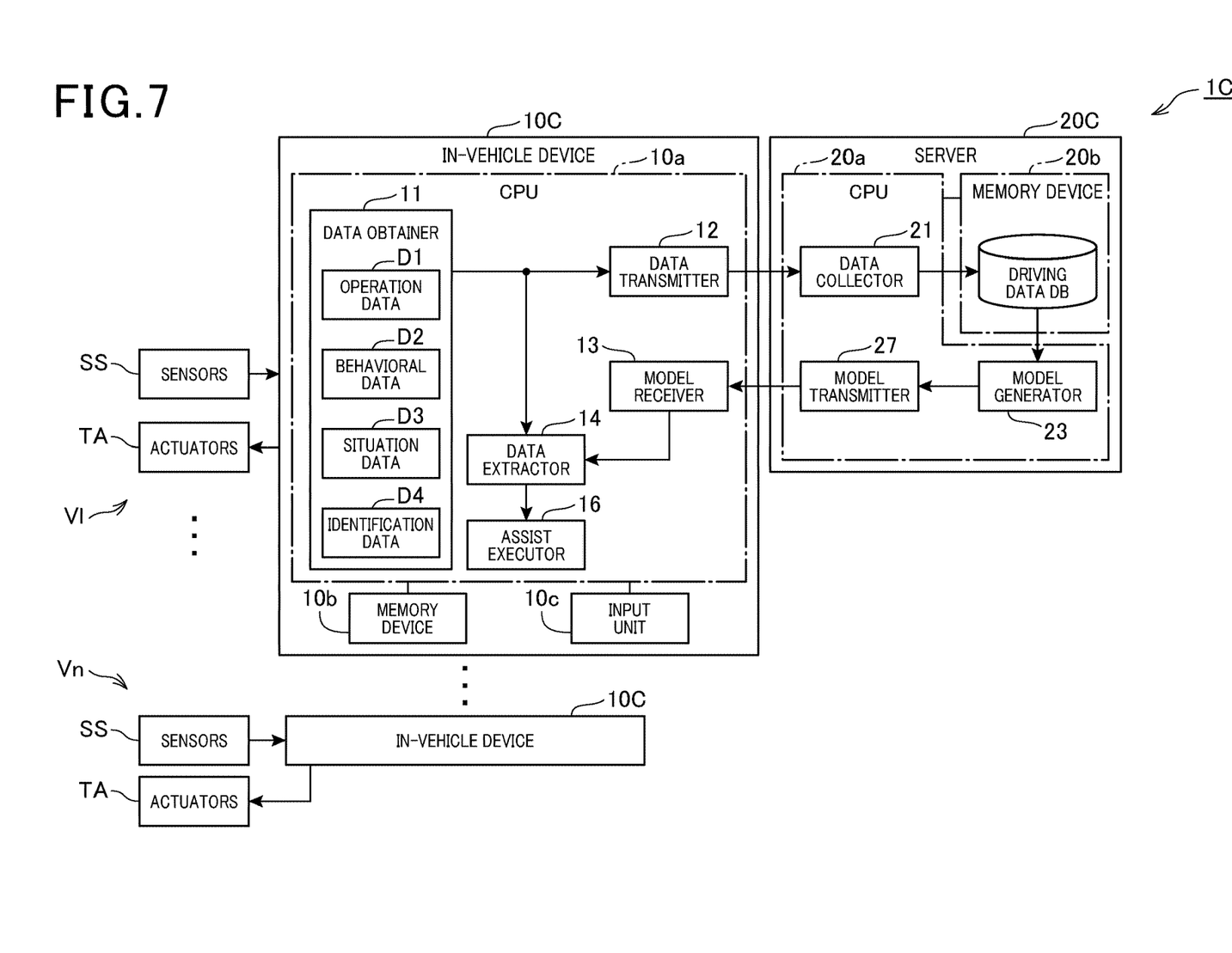
FIG. 7 is a block diagram schematically illustrating an example of the functional structure of a driving data analyzer according to the fourth embodiment of the present disclosure.

The following describes the fourth embodiment of the present disclosure with reference to FIG. 7. A driving data analyzer 1C according to the fourth embodiment differs from each of the driving data analyzers 1 to 1B in the following points. So, the following mainly describes the different points of the driving data analyzer 1C according to the fourth embodiment, and omits or simplifies descriptions of like parts between the fourth and each of the first to third embodiments, to which identical or like reference characters are assigned, thus eliminating redundant description.

The first embodiment is configured such that the server 20 generates the analytical data, and executes, based on the analytical data stored in the analytical data DB 25, various analytical tasks that analyze information included in the target driving data items, i.e. target vectors.

In contrast, the fourth embodiment is configured such that each in-vehicle device 10C generates the analytical data, and performs various cruise assist tasks, i.e. various driving assist tasks, in accordance with the analytical data.

Referring to FIG. 7, the driving data analyzer 1C includes the in-vehicle units 10C respectively installed in the vehicles V1, . . . , Vn, and a server 20C communicable by radio with the in-vehicle units 10C.

The in-vehicle unit 10C installed in each of the vehicles V1 to Vn includes the data obtainer 11, the data transmitter 12, the model receiver 13, a data extractor 14, and the driving assist executor 16.

The server 20C includes the data collector 21, the driving data DB 22, the model generator 23, and the model transmitter 27.

The model transmitter 27 is configured to cyclically or periodically transmit, i.e. broadcast, to each in-vehicle device 10C, the feature model 30 each time the training of the feature model 30 is completed.

The model receiver 13 of each in-vehicle device 10C is configured to receive the feature model 30 each time the feature model 30 is transmitted from the server 20C.

The data extractor 14 is configured to extract, from the collected target driving data sequences, analytical data based on the feature model 30 received by the model receiver 13; the analytical data is used for the driving assist executor 16 to execute various driving assist tasks. The extraction task performed by the data extractor 14 is substantially identical to the extraction task performed by the data extractor 24 according to the first embodiment.

The driving assist executor 16 of each in-vehicle device 10C is configured to (1) Predict a future behavior of the driver and/or a future behavior of the corresponding vehicle (2) Execute, based on the future behavior of the driver and/or the future behavior of the corresponding vehicle, at least one of the various driving assist tasks to control at least one of the target actuators TA installed in the corresponding vehicle, such as a steering motor, a driving motor if the corresponding vehicle is a hybrid vehicle or an electrical vehicle, a throttle valve, a brake actuator for each wheel, and/or a warning device This at least one of the various driving assist tasks enables the corresponding vehicle to be safely travelled.

As described above, the driving data analyzer 1C according to the third embodiment described in detail above obtains the following technical benefit in addition to the above technical benefits obtained by the first and third embodiments.

Specifically, the driving data analyzer 1C is configured such that each in-vehicle device 10C extracts, from the collected target driving data sequences, the analytical data, and executes, based on the future behavior of the driver and/or the future behavior of the corresponding vehicle, at least one of the various driving assist tasks. This enables each in-vehicle device 10C to merely perform communications required to receive the feature model 30, making it possible to obtain (1) Reduction in communication loads of the server 20C (2) Continuous driving assist of the vehicles V1 to Vn even if communications problem between the server 20C and each in-vehicle device 10 arises.

Modifications

The present disclosure is not limited to the descriptions of each of the first to fourth embodiments, and the descriptions of each of the first to fourth embodiments can be widely modified within the scope of the present disclosure.

Each of the first and second embodiments is configured such that the encoder 31 supplies the cell state $CE_{t+M}$ to the common network 321 as its input, and supplies the output $hE_{t+M}$ to the individual network 322 as its input. However, the present disclosure is not limited to this configuration.

Specifically, the encoder 31 can supply the cell state $CE_{t+M}$ to the individual network 322 as its input, and supply the output $hE_{t+M}$ to the common network 321 as its input. In addition, the encoder 31 can supply any one of the cell state $CE_{t+M}$ and the output $hE_{t+M}$ to each of the common network 321 and the individual network 322.

Each of the encoder 31 and the decoder 33 is comprised of a single LSTM layer or multi LSTM layers, but can be comprised of, for example, a common RNN or a gated recurrent unit (GRU). Because the GRU does not have a cell state, the output of the GRU shows latent features of an input target vector. For this reason, the encoder 31 using the GRU can be configured to send a predetermined number of elements of the output of the GRU to the common network 321, and sent the remaining elements to the individual network 322.

Each of the first to fourth embodiments is configured to use, as the at least one external factors, the identify of a driver, i.e. driver's driving habits, himself or herself of each vehicle, but the present disclosure is not limited thereto.

Specifically, the data obtainer 11 of each in-vehicle device 10 can obtain the identification data item indicative of another external factor that causes the driving data items to vary, such as (1) The type of the corresponding vehicle
(2) The current weather in a region in which the corresponding vehicle is travelling
(3) The age of the driver of the corresponding vehicle
(4) The sex of the driver of the corresponding vehicle The data obtainer 11 of each in-vehicle device 10 can obtain the identification data item indicative of a combination of the above external factors.

Each of the first to fourth embodiments is configured to (1) Prepare target vector sequences within a predetermined period as training data items and future vector sequences based on the target vector sequences as supervised data items paired to the respective training data items
(2) Train the feature model 30 based on the target vector sequences and respectively paired supervised data items, to thereby cause the feature model 30 to output predicted sequential vectors
(3) Compare the supervised data items with the respective predicted sequence vectors The present disclosure is however not limited to the above embodiments.

Specifically, the feature generator 23 can be configured to (1) Prepare target vector sequences within a predetermined period as training data items and the same target vector sequences as supervised data items paired to the respective training data items
(2) Train the feature model 30 based on the target vector sequences and respectively paired supervised data items, to thereby cause the feature model 30 to output calculated target vector sequences
(3) Compare the supervised data items with the respective calculated target vector sequences.

The functions of one element in each of the first to fourth embodiments can be distributed as plural elements, and the functions that plural elements have can be combined into one element. At least part of the structure of each of the first to fourth embodiments can be replaced with a known structure having the same function as the at least part of the structure of the corresponding embodiment. A part of the structure of each of the first to fourth embodiments can be eliminated. At least part of the structure of each of the first to fourth embodiments can be added to or replaced with the structures of the other embodiments. All aspects included in the technological ideas specified by the language employed by the claims constitute embodiments of the present invention.

The present disclosure can be implemented by various embodiments in addition to the driving data analyzer; the various embodiments include driving data analyzing systems each including in-vehicle devices and a server, programs for serving a computer as each of the in-vehicle devices and the server, storage media storing the programs, and driving data analyzing methods.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those having ordinary skill in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driving data analyzer comprising:
a data collector configured to collect, from at least one vehicle, driving data sequences while each of the driving data sequences is correlated with identification data, each of the driving data sequences including sequential driving data items, each of the driving data items representing at least one of a driver's operation of the at least one vehicle and a behavior of the at least one vehicle based on the at least one of a driver's operation, the identification data representing a type of at least one external factor that contributes to variations in the driving data items; and
a feature extractor configured to apply a data compression network model to the driving data sequences to thereby extract, from the driving data sequences, at least one latent feature independently from the type of the at least one external factor, wherein the data compression network model comprises:
an encoder configured to encode the driving data sequences to output at least one encoded data item;
an intermediate layer configured such that the at least one encoded data item of the encoder and the identification data are input to the intermediate layer; and
a decoder configured to decode an output of the intermediate layer to thereby output decoded driving data sequences,
wherein the intermediate layer comprises:
a common network configured to:
receive at least a first part of the at least one encoded data item; and
directly output the at least first part of the at least one encoded data item to the decoder; and
an individual network configured to:
receive at least a second part of the at least one encoded data item; and
supply, to the decoder, an output including the at least second part of the at least one encoded data item to which the identification data is added.

2. The driving data analyzer according to claim 1, further comprising:
a data analyzer configured to analyze, based on at least the at least one latent feature, the driving data sequences.

3. The driving data analyzer according to claim 1, wherein:
the feature extractor is configured to extract, from the driving data sequences, an output of the common network as the at least one latent feature.

4. The driving data analyzer according to claim 1, wherein:
the type of the at least one external factor includes at least first and second types of the at least one external factor; and
the feature extractor is configured to:
apply the data compression network model to the driving data sequences while the identification data that specifies one of the first and second types of the at least one external factor is input to the individual network to thereby extract, from the driving data sequences, an output of the individual network as at least one individual feature dependent on a specified one of the first and second types of the at least one external factor.

5. The driving data analyzer according to claim 1, wherein:
the type of the at least one external factor includes at least first and second types of the at least one external factor; and
the feature extractor is configured to:
apply the data compression network model to the driving data sequences while the identification data that specifies one of the first and second types of the at least one external factor is input to the individual network to thereby extract, from the driving data sequences, at least one individual feature dependent on the other of the first and second types of the at least one external factor.

6. The driving data analyzer according to claim 1, wherein:
the type of the at least one external factor includes at least first and second types of the at least one external factor; and
the feature extractor is configured to apply the data compression network model to the driving data sequences to thereby extract, from the driving data sequences, an output of the decoder as the at least one latent feature when the identification data specifies all the at least first and second types the at least one external factor or specifies no types of the at least one external factor.

7. The driving data analyzer according to claim 1, wherein:
the feature extractor is configured to input, to the decoder, an initial value of zero to thereby start input of the driving data sequences to the encoder.

8. The driving data analyzer according to claim 1, further comprising:
a model trainer configured to train the data compression model using training driving data sequences within a predetermined period until reconstructed driving data sequences output from the decoder are matched with the training driving data sequences.

9. The driving data analyzer according to claim 1, further comprising:
a model trainer configured to train the data compression model using training driving data sequences within a predetermined first period and next driving data sequences following the training driving data sequences within a predetermined second period as supervised driving data sequences that are paired to the respective training driving data sequences until decoded predicted driving data sequences output from the decoder are respectively matched with the supervised driving data sequences.

10. The driving data analyzer according to claim 9, further comprising:
a data obtainer configured to obtain the driving data sequences and the identification data of a target vehicle that is the at least one vehicle in real time,
the feature extractor being configured to:
apply the data compression network model to the driving data sequences of the target vehicle to thereby extract, from the driving data sequences of the target vehicle, predicted driving data sequences; and
a vehicle controller configured to execute travelling control of the target vehicle in accordance with the extracted predicted driving data sequences.

11. The driving data analyzer according to claim 10, further comprising:
a server incorporating therein the data collector, the model trainer, and the feature extractor; and
at least one in-vehicle device installed in the at least one vehicle and incorporating therein the data obtainer and the vehicle controller,
wherein:
the server is configured by the data collector to collect, from the at least one in-vehicle device, the driving data sequences obtained by the data obtainer; and
the at least one in-vehicle device is configured to obtain, from the server, the predicted driving data sequences for the at least one vehicle extracted by the feature extractor.

12. The driving data analyzer according to claim 10, further comprising:
a server incorporating therein the data collector and the model trainer; and
at least one in-vehicle device installed in the at least one vehicle and incorporating therein the data obtainer, the vehicle controller, and feature extractor,
wherein:
the server is configured by the data collector to collect, from the at least one in-vehicle device, the driving data sequences obtained by the data obtainer; and
the at least one in-vehicle device is configured to obtain, from the server, the data compression network model trained by the model trainer.

* * * * *